US011831146B2

(12) United States Patent
Wahlroos et al.

(10) Patent No.: US 11,831,146 B2
(45) Date of Patent: *Nov. 28, 2023

(54) METHOD AND APPARATUS FOR USE IN EARTH-FAULT PROTECTION

(71) Applicant: ABB Schweiz AG, Baden (CH)

(72) Inventors: Ari Wahlroos, Vaasa (FI); Janne Altonen, Tampere (FI)

(73) Assignee: ABB Schweiz AG, Baden (CH)

( * ) Notice: Subject to any disclaimer, the term of this patent is extended or adjusted under 35 U.S.C. 154(b) by 322 days.

This patent is subject to a terminal disclaimer.

(21) Appl. No.: 16/951,377

(22) Filed: Nov. 18, 2020

(65) Prior Publication Data

US 2021/0075209 A1 Mar. 11, 2021

Related U.S. Application Data

(63) Continuation of application No. PCT/EP2019/062765, filed on May 17, 2019.

(30) Foreign Application Priority Data

May 18, 2018 (EP) .................................... 18173216

(51) Int. Cl.
*G01R 31/52* (2020.01)
*H02H 3/16* (2006.01)
*H02H 9/08* (2006.01)

(52) U.S. Cl.
CPC ............. *H02H 3/165* (2013.01); *G01R 31/52* (2020.01); *H02H 9/08* (2013.01)

(58) Field of Classification Search
CPC .......... G01R 31/52; H02H 3/165; H02H 9/08; H02H 1/00

See application file for complete search history.

(56) References Cited

U.S. PATENT DOCUMENTS 5,764,064 A 6/1998 Eriksson et al.
9,041,383 B2 * 5/2015 Bengtsson .............. H01F 27/42
323/356

(Continued)

FOREIGN PATENT DOCUMENTS

CN 101320073 A 12/2008
CN 102959413 A 3/2013

(Continued)

OTHER PUBLICATIONS

European Patent Office, International Search Report & Written Opinion issued in corresponding Application No. PCT/EP2019/062765, dated Sep. 5, 2019, 10 pp.

(Continued)

*Primary Examiner* — Jermele M Hollington
*Assistant Examiner* — Demetrius R Pretlow
(74) *Attorney, Agent, or Firm* — Leydig, Voit & Mayer, Ltd.

(57) ABSTRACT

A method and an apparatus for use in an earth-fault protection in a three-phase electric network, the apparatus configured to detect a phase-to-earth fault in the three-phase electric network, to determine for each of the three phases of the three-phase electric network a phase current during the detected phase-to-earth fault or a change in the phase current due to the detected phase-to-earth fault, to determine an estimate of an earth-fault current on the basis of the determined phase currents or on the basis of the determined changes in the phase currents, to determine, if the estimate of the earth-fault current represents an actual earth-fault current or an apparent earth-fault current, and to determine, in response to determining that the estimate of the earth-fault current represents the actual earth-fault current, that the estimate of the earth-fault current is valid.

10 Claims, 4 Drawing Sheets

(56) References Cited

U.S. PATENT DOCUMENTS

| | | | | |
|---|---|---|---|---|
| 2005/0018371 | A1* | 1/2005 | Mladenik | H02H 3/00 361/78 |
| 2005/0195545 | A1* | 9/2005 | Mladenik | H02H 3/00 361/93.1 |
| 2008/0297163 | A1* | 12/2008 | Wahlroos | G01R 31/088 324/522 |
| 2009/0085573 | A1* | 4/2009 | Blakely | G01R 31/52 324/509 |
| 2009/0160453 | A1* | 6/2009 | Tiihonen | G01R 31/52 324/509 |
| 2009/0296289 | A1* | 12/2009 | Valdez | H02H 3/17 361/47 |
| 2011/0298468 | A1* | 12/2011 | Wahlroos | H02H 3/165 324/509 |
| 2012/0229144 | A1* | 9/2012 | Nakahara | H02H 7/06 324/510 |
| 2013/0043879 | A1* | 2/2013 | Wahlroos | H02H 3/402 324/509 |
| 2016/0091555 | A1 | 3/2016 | Drouere et al. | |
| 2016/0134101 | A1 | 5/2016 | Kalina et al. | |
| 2018/0011135 | A1* | 1/2018 | Aebersold | H02H 1/0007 |
| 2019/0079129 | A1* | 3/2019 | Valdes | H02H 3/165 |

FOREIGN PATENT DOCUMENTS

| | | |
|---|---|---|
| CN | 105359365 A | 2/2016 |
| CN | 105467268 A | 4/2016 |
| WO | 2016193529 A1 | 12/2016 |

OTHER PUBLICATIONS

European Patent Office, International Preliminary Report on Patentability issued in corresponding Application No. PCT/EP2019/062765, dated Oct. 14, 2020, 13 pp.

European Patent Office, Extended Search Report issued in corresponding Application No. 18173216.5, dated Dec. 4, 2018, 8 pp.

China National Intellectual Property Administration, Office Action in Chinese Patent Application No. 201980032946.7, 12 pp. (dated Mar. 11, 2022).

* cited by examiner

METHOD AND APPARATUS FOR USE IN EARTH-FAULT PROTECTION

FIELD OF THE INVENTION

The present invention relates to a method and an apparatus for use in earth-fault protection in a three-phase electric network.

BACKGROUND OF THE INVENTION

Earth-fault protection functions in high-impedance earthed networks, such as compensated, unearthed or high resistance earthed networks, may be based on a measurement of a zero-sequence voltage (or neutral point voltage, residual voltage $\overline{U}_o$) of the network $\overline{U}_o = \overline{U}_0 = (\overline{U}_A + \overline{U}_B + \overline{U}_C)/3$ and a residual current (or sum current) at a measuring point $\overline{I}_o = 3 \cdot \overline{I}_0 = \overline{I}_A + \overline{I}_B + \overline{I}_C$. In compensated networks, for example, the residual current $\overline{I}_o$ measured at the beginning of a feeder may not generally equal the earth-fault current $\overline{I}_{ef}$ flowing at the fault location from the faulted phase to earth. The residual current is typically only a part of the earth-fault current, and the relation between them can be written as:

$$\overline{I}_{ef} = \overline{I}_o + \overline{I}_{efFd} \text{ or} \qquad \text{Eq. 1a}$$

$$\overline{I}_o = \overline{I}_{ef} - \overline{I}_{efFd} \qquad \text{Eq. 1b}$$

where $\overline{I}_{efFd}$ equals the part of the earth-fault current produced by the faulty feeder itself. The value for $\overline{I}_{efFd}$ during a solid earth fault (i.e. the fault resistance equals zero ohms) can be approximated by using Equation 2 (neglecting the natural resistive losses of the feeder itself):

$$\overline{I}_{efFd} \approx j \cdot 3 \cdot C_{0Fd} \cdot \omega \cdot U_{PE} \qquad \text{Eq. 2}$$

where $\overline{I}_{efFd}$ is the uncompensated earth-fault current of the feeder
$\omega = 2 \cdot \pi \cdot f_n$ is the nominal angular frequency of the network,
$f_n$ is the nominal frequency of the network (e.g. 50 Hz or 60 Hz)
$C_{0Fd}$ is the total phase-to-earth capacitance of the feeder (per phase)
$U_{PE}$ is the operating phase-to-earth voltage magnitude.

From Equations 1a, 1b and 2 it can be concluded that the value of $\overline{I}_{efFd}$ may increase in modern networks (especially in rural networks) due to an increased share in installation of underground cables (value of $C_{0Fd}$ is typically significantly higher for cables compared with overhead lines), for example, and the difference between $\overline{I}_o$ and $\overline{I}_{ef}$ may thus become ever larger. This means that the residual current $\overline{I}_o$ may become worse and worse representation of the earth-fault current $\overline{I}_{ef}$ flowing at the fault location.

A problem of the solutions utilizing the residual current in earth-fault protection functions is that the earth-fault current $\overline{I}_{ef}$ may have a different magnitude due to changes in the electric network, such as any topology change in the electric network, for example, which can be due to a fault or disturbance, and the fault location and restoration process that may succeed. Also, the earth-fault current $\overline{I}_{ef}$ may have a larger than expected magnitude due to an internal failure in a compensation coil tuning system, for example. In such a case, the compensation coil may be severely detuned until the failure becomes detected, and repaired or replaced. During such conditions, for instance, the earth-fault protection based on the residual current may not operate accurately and fast enough, which may create a high risk for personal safety and equipment failure, for example.

WO 2016/193529 discloses a solution in the earth-fault protection of a three-phase electrical network. In the disclosed solution a total current is determined in a measurement point of the electrical network and an earth fault is detected. In the disclosed solution the return current caused by the earth fault is determined, which is eliminated from the total current. By elimination from the total current, the earth-fault current is determined.

BRIEF DESCRIPTION OF THE INVENTION

An object of the present invention is to provide a method and an apparatus for implementing the method so as to solve or at least alleviate the above problem or to provide an alternative solution. The objects of the invention are achieved by a method, a computer program product and an apparatus, which are characterized by what is stated in the independent claims. The preferred embodiments of the invention are disclosed in the dependent claims.

The invention is based on the idea of determining an estimate of an earth-fault current in a point of a phase-to-earth fault passing through a measuring point on the basis of determined phase currents of the three phases of the three-phase electric network or on the basis of determined changes in the phase currents of the three phases of the three-phase electric network, and then verifying, whether the determined estimate of the earth-fault current represents an actual earth-fault current and whether the determined estimate of the earth-fault current is a valid estimate or not.

An advantage of the method and apparatus of the invention is that an estimate of an earth-fault current in a point of a phase-to-earth fault on a three-phase electric line can be determined accurately and fast.

BRIEF DESCRIPTION OF THE DRAWINGS

In the following the invention will be described in greater detail by means of preferred embodiments with reference to the attached drawings, in which.

DETAILED DESCRIPTION OF THE INVENTION

The application of the various embodiments described herein is not limited to any specific system, but it can be used in connection with the earth-fault protection of various three-phase electric networks. As an example, the embodiments can be utilized in unearthed networks with an unearthed or isolated neutral, i.e. which have no intentional neutral point grounding but are grounded only by the natural phase-to-earth capacitances of the network. As another example, the embodiments can be utilized in compensated networks with a compensated neutral, also known as resonant earthed networks, where compensation of the fault current is achieved by installing one or more (Petersen) coils into neutral point(s) of the system. As a yet another example, the various embodiments can be utilized in impedance earthed networks with a neutral point provided with a resistance and/or reactance grounding, such as a high resistance and/or reactance grounding. In such networks with a high resistance earthed neutral point the value of the grounding resistance may be selected such that its value essentially corresponds to a resulting capacitive reactance of phase-to-earth admittances (~capacitances) of the galvanically connected network, for instance, such that an earth-fault current is limited approximately to a value equal to or slightly greater than the uncompensated capacitive earth-fault current of the network. The electric network, in which the various embodiments may be implemented, can be an electric power transmission or distribution network or a component thereof, for example, and may comprise several electric lines or sections. The electric network may have a radial configuration supplied from one point thereof or a loop configuration comprising one or more loops and supplied from two or more points, for instance. Moreover, the use of the various embodiments is not limited to systems employing 50 Hz or 60 Hz fundamental frequencies or to any specific voltage level.

Figure 1:
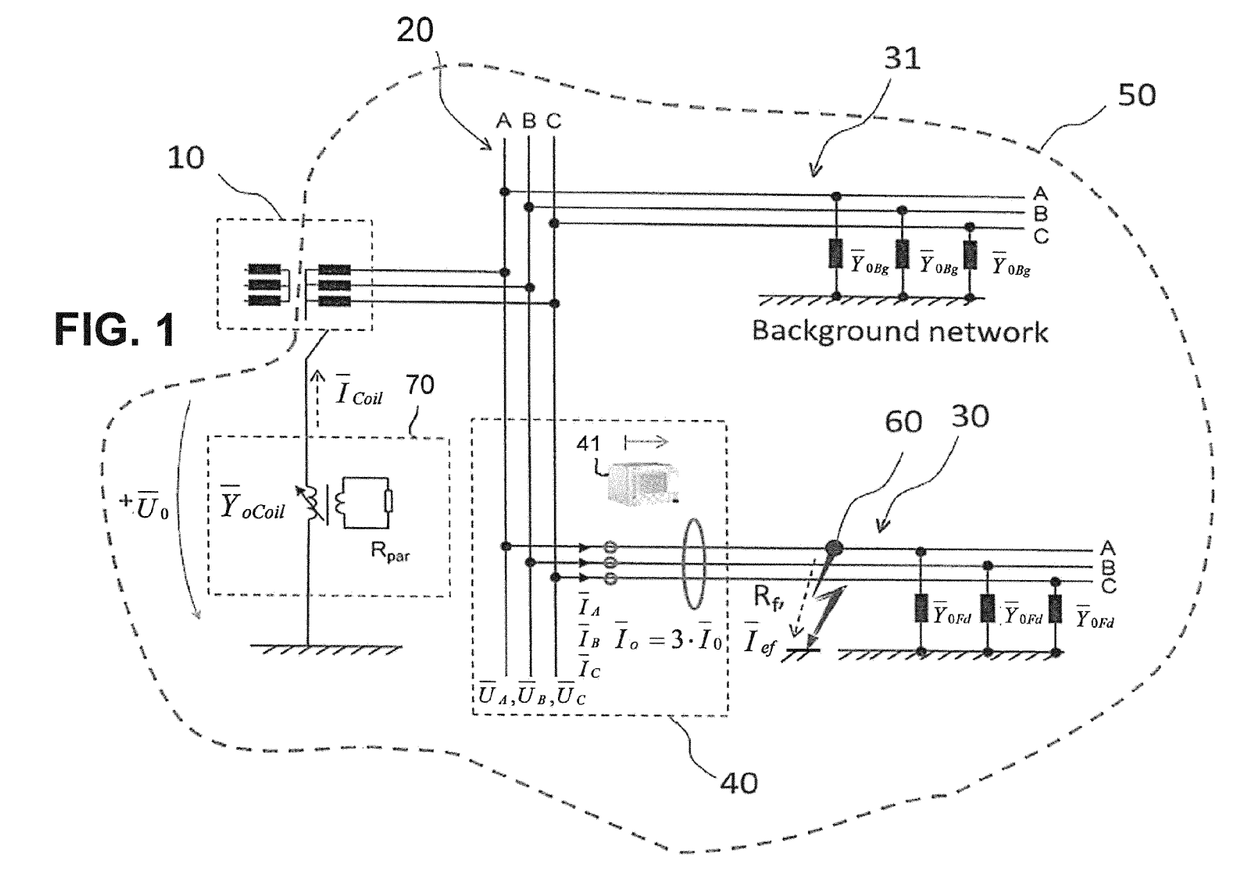
FIG. 1 shows an example of an electric network according to an embodiment.

FIG. 1 is a simplified diagram illustrating an electric network 50 in which the various embodiments can be applied. The figure shows only the components necessary for understanding the various embodiments. The exemplary three-phase network 50 with phases A, B and C may be a medium voltage (e.g. 20 kV) distribution network fed through a substation comprising a transformer 10 and a busbar 20. The exemplary network also comprises electric line outlets, i.e. feeders, of which one 30 is shown separately and represented by phase-to-earth admittances $\overline{Y}_{oFd}$ in the figure. Other possible feeders as well as other network parts, except the line 30, are referred to as a 'background network' 31 represented by phase-to-earth admittances $\overline{Y}_{oBg}$ in the figure. The illustrated network further comprises a compensation coil 70, which can be connected to the neutral point of the network via the transformer 10, for example. An admittance of the coil is $\overline{Y}_{oCoil}$ and a resistance in parallel of the coil is $R_{par}$. $\overline{I}_{Coil}$ is the current flowing through the coil 70. The figure also shows a connection arrangement 40 comprising at least one protective relay unit 41 at the connection point of the electric line 30 to the substation 10, 20, and a point of a phase-to-earth fault 60 occurring in phase A. The term 'phase-to-earth fault' herein generally refers to a single phase-to-earth fault. The protective relay unit 41 may be configured to detect an earth fault 60 on the basis of suitable measurements and consequently to operate the earth-fault protection of the electric line 30. The operating of the earth-fault protection may comprise tripping one or more switching devices in the three-phase electric network and/or preventing (blocking) a tripping of one or more switching devices in the three-phase electric network. Additionally or alternatively, the operating of the earth-fault protection may comprise switching off or limiting the earth-fault current of the detected earth fault 60 on the three-phase electric line 30 and/or performing an alarm, for example. Switching off the earth-fault current of the detected earth fault 60 could be performed by switching off the electric line 30 from the feeding point, such as the substation 10, 20, with suitable switching means, such as a circuit breaker or other kind of switchgear, which may be included in the connection arrangement 40. Limiting the earth-fault current of the detected earth fault 60 could be performed by limiting or reducing, without a complete disconnection, the earth-fault current flowing to the electric line 30 from the feeding point with suitable fault current controller means. This may be based on controlling the coil 70 during an earth fault, for example. Such a limiting of the earth-fault current may also be performed as a preliminary procedure before switching off the earth-fault current, for example. It should be noted that there may be any number of feeders or other network elements in the network. There may also be several feeding substations. Further, the invention can be utilized with a switching station without a transformer 10, for example. In the exemplary system of FIG. 1, the functionality of the invention may be located in the relay unit 41, for example. It is also possible that e.g. only some measurements are performed at the location of the relay unit 41 and the results are then transmitted to another unit or units (not shown in the figures) at another location for further processing. In other words, the relay unit 41 could be a mere measuring unit, while the functionality of the invention, or part of it, could be located in another unit or units possibly located elsewhere.

Current and voltage values that may be needed in the following embodiments may be obtained by a suitable measuring arrangement including e.g. current and/or voltage transducers at a measuring point, which may be located at the location 40 of the relay unit 41, for example. Voltage and current quantities may also be measured at different locations, for instance. In most of the existing protection systems, such values are readily available and thus the implementation of the various embodiments does not necessarily require any additional measuring arrangements or devices. How the possible current and voltage values are obtained depends, however, on the particular electric network 50. E.g. phase currents $I_A$, $I_B$, $I_C$ of the three-phase electric line 30 of the three-phase electric network 50 and/or other current and/or voltage quantities possibly needed in the various embodiments may be monitored essentially continuously or the monitoring of at least some quantities may start only upon detecting an earth fault depending on whether pre-fault values for the quantity in question are needed or not, for instance.

Figure 2:
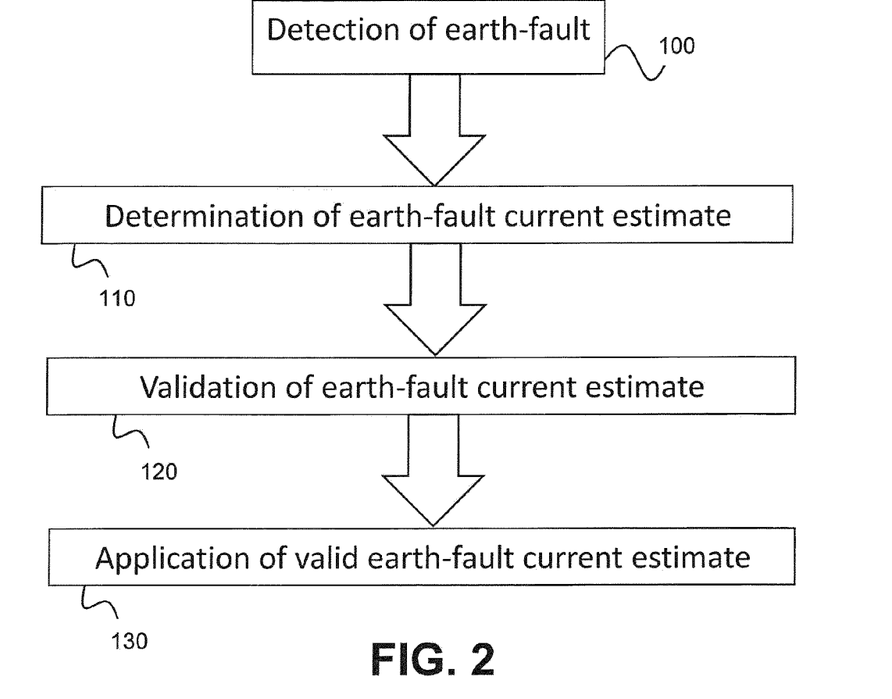
FIG. 2 shows a flow chart according to an embodiment.

FIG. 2 shows a flow chart according to an embodiment an example of which is described in the following.

According to an embodiment, a phase-to-earth fault is detected 100 in the three-phase electric network 50. Then, a phase current during the detected phase-to-earth fault is determined or a change in the phase current due to the detected phase-to-earth fault is determined at a measuring point in the three-phase electric network 50, for each of the three phases A, B, C of the three-phase electric network, and an estimate of an earth-fault current in a point of the detected phase-to-earth fault 60 passing through the measuring point 40 is determined 110 on the basis of the determined phase currents of the three phases of the three-phase electric network or on the basis of the determined changes in the phase currents of the three phases of the three-phase electric network. Next it is determined, if the estimate of the earth-fault current represents an actual earth-fault current or an apparent earth-fault current, and in response to determining that the estimate of the earth-fault current represents the actual earth-fault current, it is determined 120 that the estimate of the earth-fault current is valid.

According to an embodiment, if it is determined that the earth-fault current represents an apparent earth-fault current, it is determined that the estimate of the earth-fault current is not valid. In this case, the earth-fault current has not passed through the measuring point and thus this information can be used in preventing (blocking) a tripping of one or more switching devices in the three-phase electric network, for example.

According to an embodiment, the valid estimate of the earth-fault current is used 130 in the earth-fault protection in the three-phase electric network. Such using of the valid estimate of the earth-fault current in the earth-fault protection in the three-phase electric network may comprise operating the earth-fault protection on the basis of the valid estimate of the earth-fault current.

According to an embodiment, the operating of the earth-fault protection comprises tripping one or more switching devices in the three-phase electric network and/or preventing a tripping of one or more switching devices in the three-phase electric network, and/or switching off or limiting the earth-fault current of the detected phase-to-earth fault in the three-phase electric network.

The operating of the earth-fault protection may also comprise further or alternative measures or actions depending on the electric system in question, for instance.

The detection 100 of the phase-to-earth fault can be performed with any known method applicable in the type of network in question such as compensated, unearthed or high resistance earthed network.

According to an embodiment, the detection 100 of the phase-to-earth fault comprises, either essentially continuous or intermittent, monitoring of a zero-sequence voltage magnitude (fundamental frequency, notated with superscript index 1), or a change in the magnitude, between at least two time instances $t_1$, $t_2$, where $t_1 > t_2$, and comparing it to a predetermined threshold (the change can be calculated from zero-sequence voltage phasors or magnitudes):

$$\text{abs}(\overline{U}_0^1) > U0\_\text{start\_threshold or}$$

$$\text{abs}(\overline{U}_{0\_t1}^1 - \overline{U}_{0\_t2}^1) > U0\_\text{start\_threshold (change of phasor magnitude)}$$

or $$\text{abs}(\overline{U}_{0\_t1}^1) - \text{abs}(\overline{U}_{0\_t2}^1) > U0\_\text{start\_threshold (change of magnitude),}$$

where subscripts t1 and t2 relate to different time instances (t1>t2)

Monitoring of the zero-sequence voltage magnitude (a fundamental frequency component magnitude exceeds the threshold or a change in the magnitude between at least two time instances $t_1$, $t_2$, where $t_1 > t_2$, exceeds threshold) gives a very secure indication of a single phase-to-earth fault somewhere in the galvanically connected network. A favorable feature of the zero-sequence voltage is that it is not present during non-fault related phenomena in the network, such as switching transients or inrush current events, which may confuse some other earth-fault detection criteria.

Setting value U0_start_threshold should preferably be set as low value as possible in order to maximize the fault detection sensitivity (in terms of fault resistance). However, in order to avoid false fault detection during healthy state of the network, the detection threshold should preferably be set to a higher value (with a margin) than the zero-sequence voltage created during a healthy state due to a network phase-to-earth admittance imbalance.

According to an embodiment, in a compensated network the U0_start_threshold is not predetermined, but may be determined in real time. This may be performed by a Petersen coil regulator (i.e. a controller of a Petersen coil in the compensated network) or another unit or system connected thereto, for example. The maximum value of the zero-sequence voltage is determined during the healthy state due to the admittance imbalance of the system, Uomax_healthy_state. When the maximum value of zero-sequence voltage during the healthy state is determined, then U0_start_threshold may be determined automatically in real time as:

U0_start_threshold≥Uomax_healthy_state*q0, where q0>1 is a user defined security margin. This embodiment may enable an increased sensitivity for earth-fault detection.

According to an embodiment, the detection 100 of the phase-to-earth fault additionally or alternatively comprises monitoring of three times negative-sequence current magnitude (only fundamental frequency, fundamental frequency plus harmonics or only harmonics), or a change in the magnitude between at least two time instances $t_1$, $t_2$, where $t_1 > t_2$, and comparing it to pre-set threshold:

$$\sqrt{\sum_{h}^{m}\left(3\cdot\text{abs}(\overline{I}_2^n)\right)^2} >$$

3I2_start_threshold (with a settable pick-up delay), or $$\sqrt{\sum_{h}^{m}\left(3\cdot\text{abs}(\overline{I}_{2\_t1}^n)\right)^2} - \sqrt{\sum_{h}^{m}\left(3\cdot\text{abs}(\overline{I}_{2\_t2}^n)\right)^2} >$$

3I2_start_threshold (with a settable pick-up delay), or $$\sqrt{\sum_{h}^{m}\left(3\cdot\text{abs}(\overline{I}_{2\_t1}^n - \overline{I}_{2\_t2}^n)\right)^2} >$$

3I2_start − threshold (with a settable pick-up delay), where
n and m refer to the frequency component as a multiple of network fundamental frequency.
n=1, m=1 or
n=1 and m=any integer number >1 or
n=any integer number >1, and m is any integer number >n,
where subscripts t1 and t2 relate to different time instances (t1>t2)
and where
$\overline{I}_2^n = (\overline{I}_A^n + \overline{I}_B^n \cdot \overline{a} \cdot a + \overline{I}_C^n \cdot \overline{a})/3$ is the negative-sequence current component calculated at frequency $f_n*n$ (n=any integer number ≥1) according to the theory of symmetrical components, where $$\overline{a} = \frac{-1 + j \cdot \sqrt{3}}{2}$$

As the negative-sequence current may be created also during non-fault related phenomena in the network, such as load imbalance (i.e. the negative-sequence current is a load dependent and therefore also time dependent quantity), switching inrush condition and saturation of phase current transformers, the pick-up of earth-fault detection should preferably be set to a higher value than the three times negative-sequence current magnitude measured during the healthy-state of the network. Due to the fact that a healthy-state level may vary due to time dependent nature of loads and topology changes in the network, this detection method may not be as sensitive as a zero-sequence voltage based fault detection method. Fault detection sensitivity based on negative-sequence current magnitude may be increased by monitoring its change in magnitude between at least two time instances $t_1$, $t_2$, where $t_1 > t_2$, and comparing it to pre-set threshold. But also here, the change may be due to changes in loads. Therefore, generally, this fault detection may not be set as sensitive as the method based on the zero-sequence voltage, in order to avoid erroneous fault detections.

The pick-up of earth-fault detection based on the three times negative-sequence current magnitude should be preferably delayed, so that transient phenomena creating negative-sequence current are filtered out. This means in practice, that the overcurrent condition should be valid at least a certain duration without a temporary drop-off in order to provide the final earth-fault detection. With this condition, only a permanent source of negative-sequence current, i.e. a single-phase-to-earth fault, should preferably be detected as an earth fault. The detection of the phase-to-earth fault based on three times negative-sequence current can be used especially for coarse detection of relative high-current continuous earth faults.

According to an embodiment, in a compensated network the 3I2_start_threshold is not predetermined, but may be determined in real time. This may be performed by the Petersen coil regulator or another unit or system connected thereto, for example. The total system damping in amperes (Id) is determined and has a set detuning value in amperes (Iv). From these values the maximum expected earth-fault current can be determined as: Ief_comp=abs(Id+j*Iv). When the maximum expected earth-fault current is determined, then the 3I2_start_threshold can be determined automatically in real time as:

3I2_start_threshold≤Ief_comp*q2, where q2<1 is a user defined security margin. This embodiment may enable an increased sensitivity for earth fault detection.

According to an embodiment, the detection 100 of the phase-to-earth fault additionally or alternatively comprises a monitoring of three times zero-sequence current magnitude (only fundamental frequency, fundamental frequency plus harmonics or only harmonics), or a change in a magnitude between at least two time instances $t_1$, $t_2$, where $t_1 > t_2$, and comparing it to pre-set threshold:

$$\sqrt{\sum_{h}^{m}(3 \cdot \text{abs}(\overline{I}_0^n))^2} >$$

Io_start_threshold (with a settable pick-up delay), or $$\sqrt{\sum_{h}^{m}(3 \cdot \text{abs}(\overline{I}_{0\_t1}^n))^2} - \sqrt{\sum_{h}^{m}(3 \cdot \text{abs}(\overline{I}_{0\_t2}^n))^2} >$$

Io_start − threshold (with a settable pick−up delay), or $$\sqrt{\sum_{h}^{m}(3 \cdot \text{abs}(\overline{I}_{0\_t1}^n - \overline{I}_{0\_t2}^n))^2} >$$

Io_start − threshold (with a settable pick−up delay), where
n and m refer to the frequency component as a multiple of network fundamental frequency.
n=1, m=1 or
n=1 and m=any integer number >1 or
n=any integer number >1, and m is any integer number >n,
where subscripts $t_1$ and $t_2$ relate to different time instances ($t_1 > t_2$)
and where
$\overline{I}_0^n = (\overline{I}_A^n + \overline{I}_B^n + \overline{I}_C^n)/3$ is the zero-sequence current component calculated at frequency $f_n*n$ (n=any integer number ≥1) according to the theory of symmetrical components.

This fault detection method may be only valid, when the three times zero-sequence current has a significantly different value in the faulty and the healthy feeders. This condition may be only valid in unearthed networks, where earth-fault current produced by a protected feeder is significantly smaller compared with the total uncompensated earth-fault current of the network.

According to an embodiment, the estimate of the earth-fault current in the point of the detected phase-to-earth fault passing through the measuring point may be determined on the basis of the determined phase currents of the three phases of the three-phase electric network. An example of this embodiment is equation 3b below. According to another embodiment, the estimate of the earth-fault current in the point of the detected phase-to-earth fault passing through the measuring point may be determined on the basis of the determined changes in the phase currents of the three phases of the three-phase electric network. Examples of this embodiment include equations 3a, 4a, and 5a-5c below.

According to an embodiment, the determining of the changes in the phase currents of the three phases of the three-phase electric network comprises determining, for each of the three phases A, B, C of the three-phase electric network 50, a difference between a fundamental frequency component of the phase current during the phase-to-earth fault and the fundamental frequency component of the phase current before the phase-to-earth fault.

According to an embodiment, the determining of the changes in the phase currents of the three phases of the three-phase electric network additionally or alternatively comprises determining, for each of the three phases A, B, C of the three-phase electric network, and for at least one harmonic frequency, which is an integer multiple of the fundamental frequency of the phase current, a difference between a harmonic frequency component of the phase current during the phase-to-earth fault and the harmonic frequency component of the phase current before the phase-to-earth fault. Thus, it is possible to use only the fundamental frequency components of the phase currents, only one or more harmonic frequency components, or both the fundamental frequency components and one or more harmonic frequency components for the determining of the changes in the phase currents of the three phases of the three-phase electric network.

The estimate of the earth-fault current in the point of the detected phase-to-earth fault passing through the measuring point may be determined according to the various embodiments, or a combination thereof, described in the following. Phase currents at the measuring point 40 are measured including measuring the fundamental frequency $f_n$ component and/or one or more harmonic components (n=2, 3, 4, 5, ...). For example, in some systems e.g. $5^{th}$ and $7^{th}$ harmonic components may be dominant in practice in the earth-fault current and could be included in the measurement in addition to the fundamental component. Any harmonic component or components may be included in the measurement, if their magnitude is sufficient for an accurate measurement. This minimum value of harmonic component magnitude may be a predetermined value and it may be determined by the accuracy of the used hardware and applied measurements, for example.

A general format for phase current phasors at frequency $n*f_n$, where $f_n$ is the fundamental system frequency, can be written as:

$\overline{I}_A^n$ is the phase A current phasor at frequency $n*f_n$, $\overline{I}_B^n$ is the phase B current phasor at frequency $n*f_n$, $\overline{I}_C^n$ is the phase C current phasor at frequency $n*f_n$, where n=any integer number ≥1

The "delta" or change quantities for each of the phase current phasors may be derived (if needed in the calculations later), preferably essentially real-time, during the detected phase-to-earth fault in accordance with the following equations:

$$\Delta \bar{I}_A{}^n = \bar{I}_{A\_tF}{}^n - \bar{I}_{A\_tP}{}^n$$

$$\Delta \bar{I}_B{}^n = \bar{I}_{B\_tF}{}^n - \bar{I}_{B\_tP}{}^n$$

$$\Delta \bar{I}_C{}^n = \bar{I}_{C\_tF}{}^n - \bar{I}_{C\_tP}{}^n$$

where subscript tF relates to a time instance during the detected earth fault and tP relates to a time instance before the detected earth fault (tF>tP)

The use of the measurable change due to an earth fault at phase current phasors, enables accurate estimation of the earth-fault current.

According to an embodiment, the estimate of the earth-fault current in the point of the detected phase-to-earth fault passing through the measuring point can be determined 110 by using any of the following equations 3-5, which can be evaluated individually or together. A-B-C phase rotation is assumed in the exemplary equations:

Equation 3a (based on a change due to earth fault in a negative-sequence current component):

$$\bar{I}_{efA}{}^n = (\bar{I}_A{}^n + \bar{I}_B{}^n \cdot \bar{a} \cdot \bar{a} + \bar{I}_C{}^n \cdot \bar{a}) = 3 \cdot \Delta \bar{I}_{2A}{}^n = 3 \cdot (\bar{I}_{2A\_tF}{}^n - \bar{I}_{2A\_tP}{}^n) \quad \text{Eq. 3a1}$$

$$\bar{I}_{efB}{}^n = (\Delta \bar{I}_A{}^n \cdot \bar{a} + \Delta \bar{I}_B{}^n + \Delta \bar{I}_C{}^n \cdot \bar{a} \cdot \bar{a}) = 3 \cdot \Delta \bar{I}_{2B}{}^n = 3 \cdot (\bar{I}_{2B\_tF}{}^n - \bar{I}_{2B\_tP}{}^n) \quad \text{Eq. 3a2}$$

$$\bar{I}_{efC}{}^n = (\bar{I}_A{}^n \cdot \bar{a} \cdot \bar{a} + \bar{I}_B{}^n \cdot \bar{a} + \Delta \bar{I}_C{}^n) = 3 \cdot \Delta \bar{I}_{2C}{}^n = 3 \cdot (\bar{I}_{2C\_tF}{}^n - \bar{I}_{2C\_tP}{}^n) \quad \text{Eq. 3a3}$$

Equation 3b (based on the negative-sequence current component during the fault without pre-fault data):

$$\bar{I}_{eFA}{}^n = (\bar{I}_A{}^n + \bar{I}_B{}^n \cdot \bar{a} \cdot \bar{a} + \bar{I}_C{}^n \cdot \bar{a}) = 3 \cdot \bar{I}_{2A}{}^n = 3 \cdot \bar{I}_{2A\_tF}{}^n \quad \text{Eq. 3b1}$$

$$\bar{I}_{eFB}{}^n = (\bar{I}_A{}^n \cdot \bar{a} + \bar{I}_B{}^n + \bar{I}_C{}^n \cdot \bar{a} \cdot \bar{a}) = 3 \cdot \bar{I}_{2B}{}^n = 3 \cdot \bar{I}_{2B\_tF}{}^n \quad \text{Eq. 3b2}$$

$$\bar{I}_{eFC}{}^n = (\bar{I}_A{}^n \cdot \bar{a} \cdot \bar{a} + \bar{I}_B{}^n \cdot \bar{a} + \bar{I}_C{}^n) = 3 \cdot \bar{I}_{2C}{}^n = 3 \cdot \bar{I}_{2C\_tF}{}^n \quad \text{Eq. 3b3}$$

$$I_{ef}{}^n = \text{abs}(\bar{I}_{efA}{}^n) \text{ or } I_{ef}{}^n = \text{abs}(\bar{I}_{efB}{}^n) \text{ or } I_{ef}{}^n = \text{abs}(\bar{I}_{efC}{}^n) \quad \text{Eq. 3}$$

Equation 4a (based on a change due to earth fault in a positive-sequence current component):

$$\bar{I}_{efA}{}^n = (\Delta \bar{I}_A{}^n + \Delta \bar{I}_B{}^n \cdot \bar{a} + \Delta \bar{I}_C{}^n \cdot \bar{a} \cdot \bar{a}) = 3 \cdot \Delta \bar{I}_{1A}{}^n = 3 \cdot (\bar{I}_{1A\_tF}{}^n - \bar{I}_{1A\_tP}{}^n) \quad \text{Eq. 4a1}$$

$$\bar{I}_{efB}{}^n = (\Delta \bar{I}_A{}^n \cdot \bar{a} \cdot \bar{a} + \Delta \bar{I}_B{}^n + \Delta \bar{I}_C{}^n \cdot \bar{a}) = 3 \cdot \Delta \bar{I}_{1B}{}^n = 3 \cdot (\bar{I}_{1B\_tF}{}^n - \bar{I}_{1B\_tP}{}^n) \quad \text{Eq. 4a2}$$

$$\bar{I}_{efC}{}^n = (\Delta \bar{I}_A{}^n \cdot \bar{a} + \Delta \bar{I}_B{}^n \cdot \bar{a} \cdot \bar{a} + \Delta \bar{I}_C{}^n) = 3 \cdot \Delta \bar{I}_{1C}{}^n = 3 \cdot (\bar{I}_{1C\_tF}{}^n - \bar{I}_{1C\_tP}{}^n) \quad \text{Eq. 4a3}$$

$$I_{ef}{}^n = \text{abs}(\bar{I}_{efA}{}^n) \text{ or } I_{ef}{}^n = \text{abs}(\bar{I}_{efB}{}^n) \text{ or } I_{ef}{}^n = \text{abs}(\bar{I}_{efC}{}^n) \quad \text{Eq. 4}$$

Equations 5a-5c (Based on changes due to earth fault of phase currents):

$$\bar{I}_{efA}{}^n = \Delta \bar{I}_A{}^n - \tfrac{1}{2} \cdot (\Delta \bar{I}_B{}^n + \Delta \bar{I}_C{}^n), \quad \text{Eq. 5a1 or}$$

$$\bar{I}_{efA}{}^n = \Delta \bar{I}_A{}^n - \Delta \bar{I}_B{}^n, \quad \text{Eq. 5a2 or}$$

$$\hat{I}_{efA}{}^n = \Delta \bar{I}_A{}^n - \Delta \bar{I}_C{}^n \quad \text{Eq. 5a3}$$

$$\bar{I}_{efB}{}^n = \Delta \bar{I}_B{}^n - \tfrac{1}{2} \cdot (\Delta \bar{I}_C{}^n + \Delta \bar{I}_A{}^n), \quad \text{Eq. 5b1 or}$$

$$\bar{I}_{efB}{}^n = \Delta \bar{I}_B{}^n - \Delta \bar{I}_C{}^n \quad \text{Eq. 5b2 or}$$

$$\bar{I}_{efB}{}^n = \Delta \bar{I}_B{}^n - \Delta \bar{I}_A{}^n \quad \text{Eq. 5b3}$$

$$\bar{I}_{efC}{}^n = \Delta \bar{I}_C{}^n - \tfrac{1}{2} \cdot (\Delta \bar{I}_A{}^n + \Delta \bar{I}_B{}^n), \quad \text{Eq. 5c1 or}$$

$$\bar{I}_{efC}{}^n = \Delta \bar{I}_C{}^n - \Delta \bar{I}_A{}^n, \quad \text{Eq. 5c2 or}$$

$$\bar{I}_{efC}{}^n = \Delta \bar{I}_C{}^n - \Delta \bar{I}_B{}^n, \quad \text{Eq. 5c3}$$

$$I_{ef}{}^n = \max(\text{abs}(\bar{I}_{efA}{}^n), \text{abs}(\bar{I}_{efB}{}^n), \text{abs}(\bar{I}_{efC}{}^n)) \quad \text{Eq. 5}$$

where
$\bar{I}_{efA}{}^n$ is the estimate of the earth-fault current at frequency $n^*f_n$ assuming phase A-to-earth fault
$\bar{I}_{efB}{}^n$ is the estimate of the earth-fault current at frequency $n^*f_n$ assuming phase B-to-earth fault
$\bar{I}_{efC}{}^n$ is the estimate of the earth-fault current at frequency $n^*f_n$ assuming phase C-to-earth fault
$I_{efC}{}^n$ is the magnitude of the earth-fault current estimate at frequency $n^*f_n$
$\bar{I}_{ef}{}^n$ is the phasor of the earth-fault current estimate at frequency $n^*f_n$
$\bar{I}_{2A}{}^n$ is the negative-sequence current component at frequency $n^*f_n$ assuming phase A-to-earth fault
$\bar{I}_{2B}{}^n$ is the negative-sequence current component at frequency $n^*f_n$ assuming phase B-to-earth fault
$\bar{I}_{2C}{}^n$ is the negative-sequence current component at frequency $n^*f_n$ assuming phase C-to-earth fault
$\Delta \bar{I}_{2A}{}^n$ is the change in negative-sequence current component at frequency $n^*f_n$ due to earth fault assuming phase A-to-earth fault.
$\Delta \bar{I}_{2B}{}^n$ is the change in negative-sequence current component at frequency $n^*f_n$ due to earth fault assuming phase B-to-earth fault.
$\Delta \bar{I}_{2C}{}^n$ is the change in negative-sequence current component at frequency $n^*f_n$ due to earth fault assuming phase C-to-earth fault.
$\bar{I}_{1A}{}^n$ is the positive-sequence current component at frequency $n^*f_n$ assuming phase A-to-earth fault
$\bar{I}_{1B}{}^n$ is the positive-sequence current component at frequency $n^*f_n$ assuming phase B-to-earth fault
$\bar{I}_{1C}{}^n$ is the positive-sequence current component at frequency $n^*f_n$ assuming phase C-to-earth fault
$\Delta \bar{I}_{1A}{}^n$ is the change in positive-sequence current component at frequency $n^*f_n$ due to earth fault assuming phase A-to-earth fault.
$\Delta \bar{I}_{1B}{}^n$ is the change in positive-sequence current component at frequency $n^*f_n$ due to earth fault assuming phase B-to-earth fault.
$\Delta \bar{I}_{1C}{}^n$ is the change in positive-sequence current component at frequency $n^*f_n$ due to earth fault assuming phase C-to-earth fault.
n=1, 2, 3, . . . (integer number)

Equation 3b could be used to provide a coarse estimate of the earth-fault current, for example in cases, where pre-fault current quantities are not available. This may include special operating conditions such as switching onto fault or during an auto-reclosing sequence, for instance. Also in network conditions where the earth-fault current may be especially high, a coarse estimate of the earth-fault current may be sufficient. An additional error in the earth-fault current estimate provided by Equation 3b is due to pre-fault 312, which originates from the natural load imbalance. However, in modern three-phase networks this imbalance is typically very low in practice.

According to an embodiment, a given harmonic can be included if its magnitude exceeds a predetermined measurable threshold. This may be in practice a few amperes, for example. Any harmonic component or components may be included in the determination of the earth-fault current magnitude, if their magnitude is sufficient for an accurate measurement, for instance. Such a minimum value of a harmonic component magnitude may be a predetermined value and may be determined by the accuracy of the used hardware and applied measurement devices (such as CTs, VTs and or sensors), for example.

According to an embodiment, the magnitude of the earth-fault current estimate can be calculated as an rms (root mean square for orthogonal components) value according to Equation 6:

$$I_{ef\_rms} = \sqrt{\Sigma_{n=1}^{m}(I_{ef}^{n})^2}$$ Eq. 6 where n and m refer to the frequency component as a multiple of network fundamental frequency.

n=1 and m=any integer number, m>n

According to an embodiment, the determined earth-fault current estimate phasor can be converted into an earth-fault admittance phasor with the zero-sequence voltage (the zero-sequence voltage may be obtained from an open-delta winding of a three phase voltage transformer or may be calculated from phase-to-earth voltages at frequency $f_n*n$ (n=any integer number ≥1): $\overline{U}_0^n = (\overline{U}_A^n + \overline{U}_B^n + \overline{U}_C^n)/3$, for example) according to the following equations:

$$\overline{Y}_{ef}^n =$$ Eq. 7a $$\frac{\overline{I}_{ef}^n}{-(\overline{U}_{0\_tF}^n - \overline{U}_{0\_tP}^n)} = \frac{\overline{I}_{ef}^n}{-\Delta \overline{U}_0^n} = \text{Re}[\overline{Y}_{ef}^n] + j \cdot \text{Im}[\overline{Y}_{ef}^n] = G_{ef}^n + j \cdot B_{ef}^n$$

$$\overline{Y}_{ef}^n = \frac{\overline{I}_{ef}^n}{-\overline{U}_{0\_tF}^n} = \text{Re}[\overline{Y}_{ef}^n] + j \cdot \text{Im}[\overline{Y}_{ef}^n] = G_{ef}^n + j \cdot B_{ef}^n$$ Eq. 7b The earth-fault admittance phasor $\overline{Y}_{ef}^n$ may be calculated by using discrete phasors of $\overline{I}_{ef}^n$ and $\overline{U}_0^n$ (or $\Delta\overline{U}_0^n$). Alternatively, the earth-fault admittance $\overline{Y}_{ef}^n$ can be calculated by using accumulated phasors of $\overline{I}_{ef}^n$ and $\overline{U}_0^n$ (or $\Delta\overline{U}_0^n$) during the earth-fault by using the Cumulative Phasor Sum (CPS) method as described in EP 2624397 A1. Notation of the calculated admittance in this case is $\overline{Y}_{ef\_stab}^n$, "Stabilized admittance", and it may be calculated according to Equations 7c-7d:

$$\overline{Y}_{ef\_stab}^n =$$ Eq. 7c $$\frac{CPS(\overline{I}_{ef}^n)}{CPS(-\Delta\overline{U}_0^n)} = \text{Re}[\overline{Y}_{ef\_stab}^n] + j \cdot \text{Im}[\overline{Y}_{ef\_stab}^n] = G_{ef\_stab}^n + j \cdot B_{ef\_stab}^n$$

$$\overline{Y}_{ef\_stab}^n =$$ Eq. 7d $$\frac{CPS(\overline{I}_{ef}^n)}{CPS(-\overline{U}_{0\_tf}^n)} = \text{Re}[\overline{Y}_{ef\_stab}^n] + j \cdot \text{Im}[\overline{Y}_{ef\_stab}^n] = G_{ef\_stab}^n + j \cdot B_{ef\_stab}^n$$

As in the case of a solid earth-fault (the fault resistance $R_F=0\Omega$) the value of $\underline{U}_0$ equals the phase-to-earth voltage of the system $U_{PE}$, the calculated $\overline{Y}_{ef}^n$ value or $\overline{Y}_{ef\_stab}^n$ value can be converted from the admittance domain into the current domain by using a fixed scalar conversion factor $U_{PE}$. Additionally, as the signs of the reactive components are reversed in the admittance domain, i.e. capacitive susceptance is positive and inductive susceptance is negative, the imaginary term of $\overline{Y}_{ef}^n$ or $\overline{Y}_{ef\_stab}^n$ tan should be reversed, i.e. by applying a complex conjugate. Finally, the conversion equation from admittance domain to current domain becomes:

$$\hat{I}_{ef}^{n*} = \text{conj}(\overline{Y}_{ef}^n) \cdot U_{PE}$$ Eq. 7e or $$\hat{I}_{ef\_stab}^{n*} = \text{conj}(\overline{Y}_{ef\_stab}^n) \cdot U_{PE}$$ Eq. 7f The admittance based earth-fault current estimate in the current domain $\hat{I}_{ef}^{n*}$ or $\hat{I}_{ef\_stab}^{n*}$, can also be scaled to match the actual value of earth-fault current when there is fault resistance involved in the fault. This can be achieved by multiplying the admittance based estimate of the earth-fault current $\hat{I}_{ef}^{n*}$ or $\hat{I}_{ef\_stab}^{n*}$ by the measured relative zero-sequence voltage magnitude $\text{abs}(\underline{U}_0^n)/U_{PE}$:

$$\hat{I}_{ef}^{n**} = \hat{I}_{ef}^{n*} \cdot \text{abs}(-\underline{U}_0^n)/U_{PE}$$ Eq. 8a or $$\hat{I}_{ef\_stab}^{n**} = \hat{I}_{ef\_stab}^{n*} \cdot \text{abs}(-\underline{U}_0^n)/U_{PE}$$ Eq. 8b The notation $\hat{I}_{ef}^{n}$ or $\hat{I}_{ef\_stab}^{n}$ represents the admittance based earth-fault current estimate in current domain, which is obtained through conversion from the calculated admittance, taking into account the damping effect of fault resistance. The admittance based earth-fault current estimate $\hat{I}_{ef}^{n*}$, $\hat{I}_{ef\_stab}^{n*}$ or $\hat{I}_{ef}^{n}$, $\hat{I}_{ef\_stab}^{n}$ could be used in all calculations of the various embodiments described herein instead of earth-fault current estimate $\overline{I}_{ef}^n$.

A benefit of such admittance based equations possibly together with the CPS-calculation is that they can provide a very stable estimate of the earth-fault current regardless of fault type related oscillations (e.g. during re-striking earth fault) in the measured current and/or voltage quantities. This in turn enables a reliable and accurate implementation and performance of various applications using the earth-fault current estimate.

According to an embodiment, all earth-fault current estimates can be converted into earth-fault power with the measured zero-sequence voltage according to the following equations:

$$\overline{S}_{ef}^n = \text{conj}(\overline{I}_{ef}^n) \cdot -(\overline{U}_{0\_tF}^n - \overline{U}_{0\_tP}^n) = \text{conj}(\overline{I}_{ef}^n) \cdot -\Delta\overline{U}_0^n = \text{Re}$$
$$\lfloor\overline{S}_{ef}^n\rfloor + j \cdot \text{Im}\lfloor\overline{S}_{ef}^n\rfloor = P_{ef}^n + j \cdot Q_{ef}^n$$ Eq. 9a $$\overline{S}_{ef}^n = \text{conj}(\overline{I}_{ef}^n) \cdot -\overline{U}_{0\_tF}^n = \text{Re}\lfloor\overline{S}_{ef}^n\rfloor + j \cdot \text{Im}\lfloor$$
$$\overline{S}_{ef}^n\rfloor = P_{ef}^n + j \cdot Q_{ef}^n$$ Eq. 9b The earth-fault power $\overline{S}_{ef}^n$ may be calculated using discrete phasors of $\overline{I}_{ef}^n$ and $\overline{U}_0^n$ (or $\Delta\overline{U}_0^n$).

Alternatively, the earth-fault power $\overline{S}_{ef}^n$ can be calculated by using accumulated phasors of $\overline{I}_{ef}^n$ and $\overline{U}_0^n$ (or $\Delta\overline{U}_0^n$) by using the cumulative phasor sum method as described in EP 2624397 A1.

$$\hat{I}_{ef^{**}}^n = \overline{I}_{ef}^n * \cdot \frac{\text{abs}(-\overline{U}_{0\_tF}^n)}{U_{PE}}$$ Eq. 10a $$= \text{conj}(\overline{Y}_{ef}^n) \cdot U_{PE} \cdot \frac{\text{abs}(-\overline{U}_{0\_tF}^n)}{U_{PE}}$$

$$= \text{conj}\left(\frac{\overline{I}_{ef}^n}{-\overline{U}_{0\_tF}^n}\right) \cdot U_{PE} \cdot \frac{\text{abs}(-\overline{U}_{0\_tF}^n)}{U_{PE}}$$

$$= \text{conj}\left(\frac{\overline{I}_{ef}^n}{-\overline{U}_{0\_tF}^n}\right) \cdot \text{abs}(-\overline{U}_{0\_tF}^n) \text{ or}$$

$$\hat{I}_{ef^{**}}^n = \text{conj}\left(\frac{CPS(\overline{I}_{ef}^n)}{CPS(-\overline{U}_{0\_tF}^n)}\right) \cdot \text{abs}(-\overline{U}_{0\_tF}^n)$$ Eq. 10b The earth-fault power $\overline{S}_{ef}^n$ can then be calculated as:

$$\overline{S}_{ef}^{n} = conj(\overline{I}_{ef}^{n}) \cdot -\overline{U}_{0\_tF}^{n} =$$ Eq. 10c $$\frac{\overline{I}_{ef}^{n}}{-\overline{U}_{0\_tF}^{n}} \cdot abs(-\overline{U}_{0\_tF}^{n}) \cdot -\overline{U}_{0\_tF}^{n} = \overline{I}_{ef}^{n} \cdot abs(-\overline{U}_{0\_tF}^{n}) \text{ or}$$

$$\overline{S}_{ef}^{n} = conj(\overline{I}_{ef}^{n}) \cdot -\overline{U}_{0\_tF}^{n} = \frac{CPS(\overline{I}_{ef}^{n})}{CPS(-\overline{U}_{0\_tF}^{n})} \cdot abs(-\overline{U}_{0\_tF}^{n}) \cdot -\overline{U}_{0\_tF}^{n}$$

A validation 120 of the determined earth-fault current estimate is performed in order to distinguish an actual (true) earth-fault current from an apparent (false) earth-fault current. In case the earth-fault current $\overline{I}_{ef}^{n}$ or $I_{ef}^{n}=abs(\overline{I}_{ef}^{n})$ is estimated in a measuring point, through which the actual earth-fault current does not flow, such as measuring point located in a healthy feeder of the electric network, for example, then an apparent earth-fault current may be measured due to e.g. practical measurement inaccuracies, and/or due to the behavior of the measured phase currents during e.g. restriking earth faults.

According to an embodiment, the determining, if the estimate of the earth-fault current represents an actual earth-fault current or an apparent earth-fault current, is based on one or more predetermined quantities comprising at least one current quantity at the measuring point. According to an embodiment, the determining may be based at least on a zero-sequence voltage of the three-phase electric network and the residual current at the measuring point, and/or on real and/or imaginary part of the estimate of the earth-fault current, and/or on real and/or imaginary part of the residual current at the measuring point and real and/or imaginary part of the estimate of the earth-fault current, and/or on the negative-sequence current component at the measuring point.

According to an embodiment, the validation 120 of the determined estimate of the earth-fault current may be performed according to any of the embodiments described in the following. According to an embodiment, for identification of an actual earth-fault current, any known directional zero-sequence based method using the zero-sequence voltage and the residual current (or equivalently using quantities derived therefrom or indicative thereof, such as power or admittance) can be used. According to an embodiment, the determining may be based at least on amplitude, phase angle, real and/or imaginary part of the residual current at the measuring point, on amplitude, phase angle, real and/or imaginary part of the residual power at the measuring point, on amplitude, phase angle, real and/or imaginary part of the residual admittance at the measuring point. According to an embodiment, the validation 120 of the determined estimate of the earth-fault current may be performed at least according to the amplitude of three times negative-sequence current component at the measuring point.

According to an embodiment, estimated $\overline{I}_{ef}^{n}$ for $I_{ef}^{n}=abs(\overline{I}_{ef}^{n})$ is considered to represent the actual earth-fault current when any directional zero-sequence based method using the zero-sequence voltage and the residual current (or equivalently using quantities derived therefrom or indicative thereof, such as power or admittance) indicates that earth-fault current estimate $\overline{I}_{ef}^{n}$ or $I_{ef}^{n}=abs(\overline{I}_{ef}^{n})$ is from the "true" faulty feeder (where the earth fault is located). In practice this means that such directional zero-sequence based method indicates that earth fault is located in front of the measuring point.

This information can be calculated internally using the zero-sequence voltage and the residual current or it can be calculated externally and obtained as input signals (true/false). An example of an external validation of the earth-fault current estimate is an earth-fault protection function operating with the locos-principle. When a start or operate output (an indication of the faulted feeder) from such a directional protection is brought as an input to the earth-fault current estimator, then the validity of an actual earth-fault current estimate can be confirmed, for example.

According to an embodiment, for identification of an actual earth-fault current, the earth-fault current estimate $\overline{I}_{ef}^{n}$ (or equivalently any quantity derived therefrom or indicative thereof, such as power or admittance) may be divided into real and/or imaginary parts and compare their values to predefined thresholds. Equivalently, for identification of an actual earth-fault current, from the real and imaginary parts, the phase angle of earth-fault current estimate $\overline{I}_{ef}^{n}$ can be determined and compared to predefined threshold.

According to an embodiment, in a compensated network for identification of an actual earth-fault current, the earth-fault current estimate Z f (or equivalently any quantity derived therefrom or indicative thereof, such as power or admittance) may be divided into real and/or imaginary parts and their values may be compared to thresholds determined in real time. This may be performed by the Petersen coil regulator or another unit or system connected thereto, for example. The total system damping is determined in amperes (Id) and has a set detuning value in amperes (Iv). From these values the validation threshold can be determined automatically in real time:

real_threshold≤$Id*q3$, imag_threshold≤$Iv*q4$, amplitude_threshold≤$abs(Id+j*Iv)*q5$ where q3-q5<1 is a user defined security margin.

For example, applying an earth-fault current based method (similarly for the derived earth-fault power and earth-fault admittance), where the magnitude of the real-part of the operation quantity at fundamental frequency is calculated phase-specifically utilizing phase-specific earth-fault current estimates ($\overline{I}_{efA}^{n}$, $\overline{I}_{efB}^{n}$, $\overline{I}_{efC}^{n}$) with the zero-sequence voltage:

$Ief \cos A^1 = real(\overline{I}_{efA}^1) = abs(\overline{I}_{efA}^1) \cdot \cos(phi_{efA}^1)$  Eq. 11a1

$Ief \cos B^1 = real(\overline{I}_{efB}^1) = abs(\overline{I}_{efB}^1) \cdot \cos(phi_{efB}^1)$  Eq. 11a2

$Ief \cos C^1 = real(\overline{I}_{efC}^1) = abs(\overline{I}_{efC}^1) \cdot \cos(phi_{efC}^1)$  Eq. 11a3 and by comparing the real-parts of phase specific earth-fault current estimates at fundamental frequency according to the equation:

$Ief \cos^1 = \max(Ief \cos A^1, Ief \cos B^1, Ief \cos C^1) > $threshold  Eq. 11 where
$phi_{efA}^1$, $phi_{efB}^1$, $phi_{efC}^1$ is the phase angle difference between $\overline{U}_0^1$ or $-\overline{U}_0^1$ and the phase-specific earth-fault current phasors ($\overline{I}_{efA}^1$, $\overline{I}_{efB}^1$, $\overline{I}_{efC}^1$) at the fundamental frequency during the earth fault.

According to an embodiment, the identification of an actual earth-fault current can be accomplished by comparing the real part of the earth-fault current estimate $\overline{I}_{ef}$ (or quantities derived thereof such as power or admittance) with the real-part of the measured residual current (or quantities derived thereof such as power or admittance) and/or by comparing the imaginary part of the earth-fault current estimate $\overline{I}_{ef}$ (or quantities derived thereof such as power or admittance) with the imaginary part of the measured residual current (or quantities derived thereof such as power or admittance); identification of an actual earth-fault current can be done, when their difference does not exceed a predefined threshold:

For example:

$$Io\ \cos^1 = \text{real}(\overline{I}_0^1) = \text{abs}(\overline{I}_0^1) \cdot \cos(\text{phi}_0^1) \qquad \text{Eq. 12a1}$$

$$Ief\ \cos^1 = \max(Ief\ \cos A^1, Ief\ \cos B^1, Ief\ \cos C^1) \qquad \text{Eq. 12a2}$$

where
$\text{phi}_0^1$ is the phase angle difference between $\overline{U}_0^1$ or $-\overline{U}_0^1$ and $\overline{I}_0^1$ phasors during the earth fault.

Then identification of an actual earth-fault current can be done with the following equation:

$$\text{abs}(Io\ \cos^1 - Ief\ \cos^1) < \text{threshold}, \qquad \text{Eq. 12a}$$

or $$\text{abs}(Io\ \cos^1) - \text{abs}(Ief\ \cos^1) < \text{threshold} \qquad \text{Eq. 12b}$$

According to an embodiment, for identification of an actual earth-fault current, the earth-fault current estimate can be calculated with $$I_{ef}^n = \sqrt{\sum_{n}^{m}(3 \cdot \text{abs}(\overline{I}_{2\_tF}^n))^2} > \qquad \text{Eq. 13}$$

Ief_identification_threshold (with a settable pick-up delay), where
n and m refers to the frequency component as a multiple of network fundamental frequency.
n=1, m=1 or
n=1 and m=any integer number >1 or
n=any integer number >1, and m is any integer number >n, Ief_identification_threshold is a preset threshold.

According to an embodiment, the overcurrent condition should be valid at least certain duration without a temporary drop-off in order to provide a final earth-fault detection. With this condition, only a permanent source of negative-sequence current, i.e. a single phase-to-earth fault, should be detected as an earth fault. Identification of an actual earth-fault current based on three times negative-sequence current is especially suited for continuous earth faults with relative high earth-fault current. In practice, the set Ief_identification_threshold value should preferably be coarse, such that it considers all the possible non-fault related phenomena, which may produce an apparent earth-fault current estimate.

According to an embodiment, in a compensated network the Ief_identification_threshold is not predetermined, but may be determined in real time. This may be performed by the Petersen coil regulator or another unit or system connected thereto, for example. The total system damping is determined in amperes (Id) and has a set detuning value in amperes (Iv). From these values the Ief_identification_threshold can be determined automatically in real time as:
Ief_identification_threshold ≤ abs(Id+j*Iv)*q6, where q6<1 is a user defined security margin.

If the determined estimate of the earth-fault current is found to represent an actual earth-fault current then it may be determined 120 that the determined estimate of the earth-fault current is valid. The validity of the determined estimate of the earth-fault current also indicates that the fault is located on a feeder or line outlet, which is located downstream (from the source of earth-fault current i.e. downstream of the primary substation) of the measuring point, i.e. true earth-fault current has passed the measuring point. This information can thus be used to determine if a single feeder or line outlet including their possible branches or sections is faulted or which feeder or line outlet out of two or more parallel feeders or line outlets is faulted.

Some embodiments may require that the faulted phase (phase A, phase B or phase C) of the electric network is detected. For example, in order to calculate an estimate for the fault resistance, the faulted phase should be known. Such detection of the faulted phase could be performed with any known method, for instance.

Alternatively, the detection of the faulted phase could be performed according to one or more of the following embodiments:

When Equations 5a1, 5b1 and 5c1 are applied:
max $(I_{efA}^n, I_{efB}^n, I_{efC}^n)$; the maximum value then indicates the faulted phase, When Equations 5a2, 5b2 and 5c2 are applied:
If $I_{efA}^n$ provides the minimum, then healthy phases are A and B, and faulty phase is C
If $I_{efB}^n$ provides the minimum, then healthy phases are B and C, and faulty phase is A
If $I_{efC}^n$ provides the minimum, then healthy phases are C and A, and faulty phase is B When Equations 5a3, 5b3 and 5c3 are applied:
If $I_{efA}^n$ provides the minimum, then healthy phases are A and C, and faulty phase is B
If $I_{efB}^n$ provides the minimum, then healthy phases are B and A, and faulty phase is C
If $I_{efC}^n$ provides the minimum, then healthy phases are C and B, and faulty phase is A And/or using the real parts of the phase-specific earth-fault current estimates (or derived earth-fault power and earth-fault admittance) with the zero-sequence voltage:
real($I_{ef}^n$)=max (real($I_{efA}^n$), real($I_{efB}^n$), real($I_{efC}^n$)); the maximum value then indicates the faulted phase.
where Equations 5a1-5a3 or 5b1-5b3 or 5c1-5c3 are applied And/or by comparing the magnitude of the real-part of the operation quantity calculated with the fundamental frequency zero-sequence voltage and the zero-sequence current, including:

$$Io\ \cos^1 = \text{real}(\overline{I}_0^1) = \text{abs}(\overline{I}_0^1) \cdot \cos(\text{phi}_0^1) \qquad \text{Eq. 14a1}$$

$$Po^1 = \text{real}(\overline{I}_0^1 \cdot -\overline{U}_0^1) = \text{abs}(\overline{I}_0^1 \cdot \overline{U}_0^1) \cdot \cos(\text{phi}_0^1) \qquad \text{Eq. 14a2}$$

$$Go^1 = \text{real}(\overline{I}_0^1/\overline{U}_0^1) = \text{abs}(I_0^1/\overline{U}_0^1) \cdot \cos(\text{phi}_0^1) \qquad \text{Eq. 14a3}$$

where $\text{phi}_0^1$ is the phase angle difference between $\overline{U}_0^1$ or $-\overline{U}_0^1$ and $\overline{I}_0^1$ phasors with the magnitude of the real-part of the operation quantity calculated with the fundamental frequency zero-sequence voltage and the estimated earth-fault current, $$Ief\ \cos^1 = \text{real}(\overline{I}_{ef}^1) = \text{abs}(\overline{I}_{ef}^1) \cdot \cos(\text{phi}_{ef}^1) \qquad \text{Eq. 14a4}$$

$$Pef^1 = \text{real}(\overline{I}_{ef} \overline{U}_0^1) = \text{abs}(\overline{I}_{ef}^1 \cdot \overline{U}_0^1) \cdot \cos(\text{phi}_{ef}^1) \qquad \text{Eq. 14a5}$$

$$Gef^1 = \text{real}(\overline{I}_{ef}^1/\overline{U}_0^1) = \text{abs}(\overline{I}_{ef}^1/\overline{U}_0^1) \cos(\text{phi}_{ef}^1) \qquad \text{Eq. 14a6}$$

where $\text{phi}_{ef}^1$ is the phase angle difference between $\overline{U}_0^1$ or $-\overline{U}_0^1$ and $\overline{I}_{ef}^1$ phasors where three equations describing three possible phase-to-earth faults (phase A-to-earth, phase B-to-earth and phase C-to-earth) are derived. For example, when earth-fault admittance based equation Eq. 14a6 is applied, then the three equations describing three possible phase-to-earth faults are:

$$Gef_A^1 = \text{real}(\bar{I}_{efA}^1/\bar{U}_0^1) = \text{abs}(\bar{I}_{efA}^1/\bar{U}_0^1) \cdot \cos(\text{phi}_{efA}^1) \quad \text{Eq. 14a6a}$$

$$Gef_B^1 = \text{real}(\bar{I}_{efB}^1/\bar{U}_0^1) = \text{abs}(\bar{I}_{efB}^1/\bar{U}_0^1) \cdot \cos(\text{phi}_{efB}^1) \quad \text{Eq. 14a6b}$$

$$Gef_C^1 = \text{real}(\bar{I}_{efC}^1/\bar{U}_0^1) = \text{abs}(\bar{I}_{efC}^1/\bar{U}_0^1) \cdot \cos(\text{phi}_{efC}^1) \quad \text{Eq. 14a6c}$$

The faulted phase can be identified as being the one, whose value is closest to the value calculated with the zero-sequence voltage and the zero-sequence current. Additionally the sign of the real-part of the operation quantity calculated with the fundamental frequency zero-sequence voltage and the zero-sequence current should agree with the sign of the phase specific real-part of the operation quantity calculated with the fundamental frequency zero-sequence voltage and the estimated earth-fault current.

According to an embodiment, all earth-fault current estimates may be used in the admittance based equations, where the CPS calculation can be applied, such that oscillations in them on are suppressed (filtered), especially during restriking type of earth faults.

The determined valid estimate of the earth-fault current is an estimate of the earth-fault current in the point of the detected phase-to-earth fault 60 passing through the measuring point 40. In a radial network 50 such as that in the example of FIG. 1, where all the earth-fault current in the point of the detected phase-to-earth fault 60 passes or flows through a single measuring point 40 in which a valid estimate of the earth-fault current is established, it follows that the determined valid estimate of the earth-fault current is an estimate of the total earth-fault current in the point of the detected phase-to-earth fault 60.

However, in case of a looped network comprising one or more loops, the point of the phase-to-earth fault 60 may be fed from two or more different routes simultaneously. Hence, in a looped network an estimate of the total earth-fault current in the point of the phase-to-earth fault 60 can be determined as a sum of such valid estimates of the earth-fault current each of which estimates is made along a different route and which estimates cover all the routes leading to the phase-to-earth fault 60. As an example, if an electric line is fed from both ends thereof and the point of the phase-to-earth fault 60 is on the electric line, then valid estimates of the earth-fault current can be established at measuring points at both ends of the electric line. Then the estimate of the total earth-fault current in the point of the phase-to-earth fault is equal to the sum of the two valid estimates of the earth-fault current established at the measuring points at the two ends of the electric line.

According to an embodiment, the valid estimate of the earth-fault current may be used 130 in the earth-fault protection in the three-phase electric network in different ways. The using of the valid estimate of the earth-fault current in the earth-fault protection in the three-phase electric network may comprise operating the earth-fault protection on the basis of the valid estimate of the earth-fault current. The valid estimate of the earth-fault current may be used directly in the earth-fault protection in the three-phase electric network or via one or more (possibly intermediate) quantities, such as an voltage, power, admittance, energy or fault resistance, derived therefrom or based on it.

Figure 3:
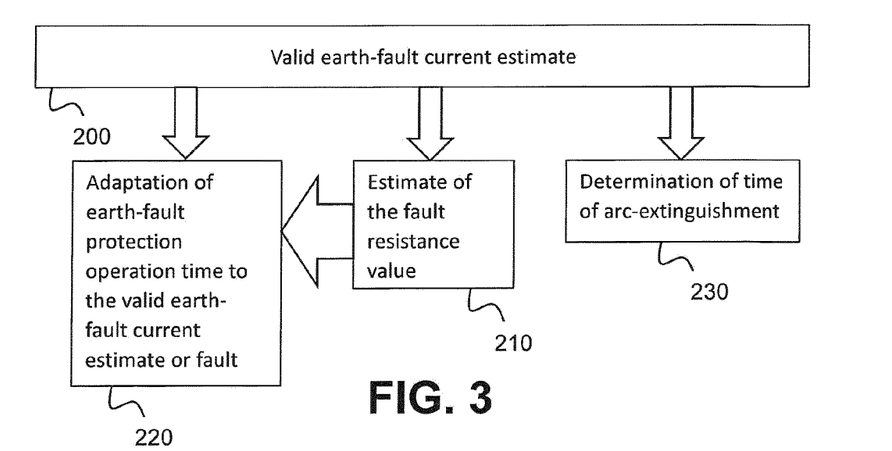
FIG. 3 shows a flow chart according to an embodiment.

FIG. 3 shows a flow chart according to an embodiment, which shows some possible embodiments for using the valid estimate of the earth-fault current in the earth-fault protection in the three-phase electric network. The valid estimate of the earth-fault current 200 may be used for determining 210 of an estimate of the fault resistance value. Alternatively or additionally, the valid estimate of the earth-fault current 200 may be used for an adaptation 220 of an earth-fault protection operation speed. For this purpose the possible estimate of the fault resistance value may also be used. Alternatively or additionally, the valid estimate of the earth-fault current 200 may be used for determination of a time of an arc extinguishment. In the following some possible embodiments for using the valid estimate of the earth-fault current in the earth-fault protection in the three-phase electric network are described.

According to an embodiment, an adaptation 220 of the earth-fault protection operation time to the magnitude of the valid earth-fault current estimate may be performed according to a predetermined earth-fault current magnitude or a quantity derived therefrom: voltage, power, admittance, energy or fault resistance vs. protection operation time characteristics, for example. The operation time for the earth-fault protection can be determined directly on the basis of the valid estimate of the earth-fault current magnitude. The operation time for the earth-fault protection can also be determined indirectly on the basis of the determined estimate of the earth-fault current by first determining a fault resistance estimate or a touch voltage estimate (or energy or power, for example) and then determining the operation time for the earth-fault protection, for example.

According to an embodiment, the operation time for the earth-fault protection is determined directly on the basis of the determined estimate of the earth-fault current in the point of the detected earth fault on the three-phase electric line 30. In this case the operation time for the earth-fault protection can be directly based on the magnitude of the estimated earth-fault current according to a predetermined function, such as an amplitude vs. operation time function.

Figure 4:
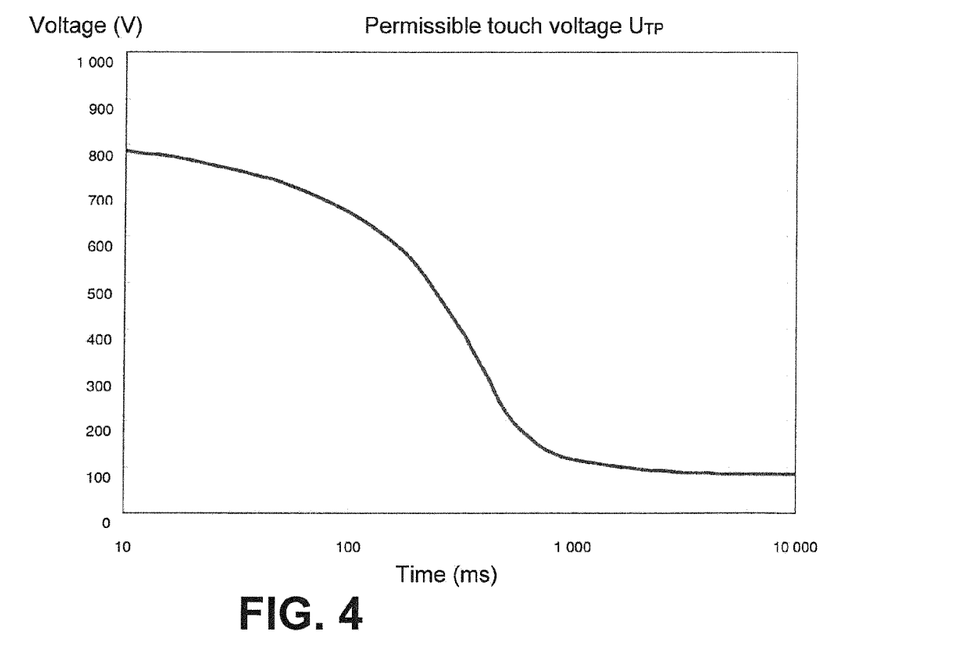
FIG. 4 shows an example of permissible touch voltages depending on the duration of current flow.

According to an embodiment, an estimate of a touch voltage $U_T$ at the point of the detected earth fault on the three-phase electric line is determined first, and the operation time for the earth-fault protection is then determined on the basis of the determined estimate of the touch voltage. This can be implemented according to applicable electrical safety codes and standards, such as Cenelec HD 637 S1 (FIG. 4 showing permissible touch voltages Un depending on the duration of current flow according to HD 637 S1), utilizing Equation 15:

$$U_{Tp} = k \cdot r \cdot R_E \cdot I_{ef} \quad \text{Eq. 15}$$

where k is a pre-determined coefficient (e.g. 0.25, 0.5 or 1.0), describing the share of touch voltage from total Earth Potential Rise (EPR) at the fault location due to the earth fault.

r is a pre-determined factor, the so-called current division or reduction factor, taking into account that not all of the earth-fault current will flow back through "remote" earth. A portion of the earth-fault current may have alternative return paths, e.g. cable sheaths etc. Therefore, a pre-determined current division factor may be applied to account for the proportion of the fault current, which flows back through "remote" earth. A current division factor 1.0 means that 100% of earth-fault current flows back through a "remote" earth.

$R_E$ is pre-determined value of the maximum grounding resistance encountered in the electric line. This value can be measured at the time the earthing is constructed and stored in the utility DMS-database, for example.

$I_{ef}$ is the magnitude of estimated earth-fault current (e.g. fundamental frequency or RMS-value)

A direct compliance of protection operation speed to applicable electrical safety codes and standards, such as HD 637 S1, can thus be achieved by utilizing Equation 15. An example of applying the valid earth-fault current estimate into the adaptation of the earth-fault protection operation time according to an operate speed requirement as per HD 637 S1 is shown below.

Figure 5:
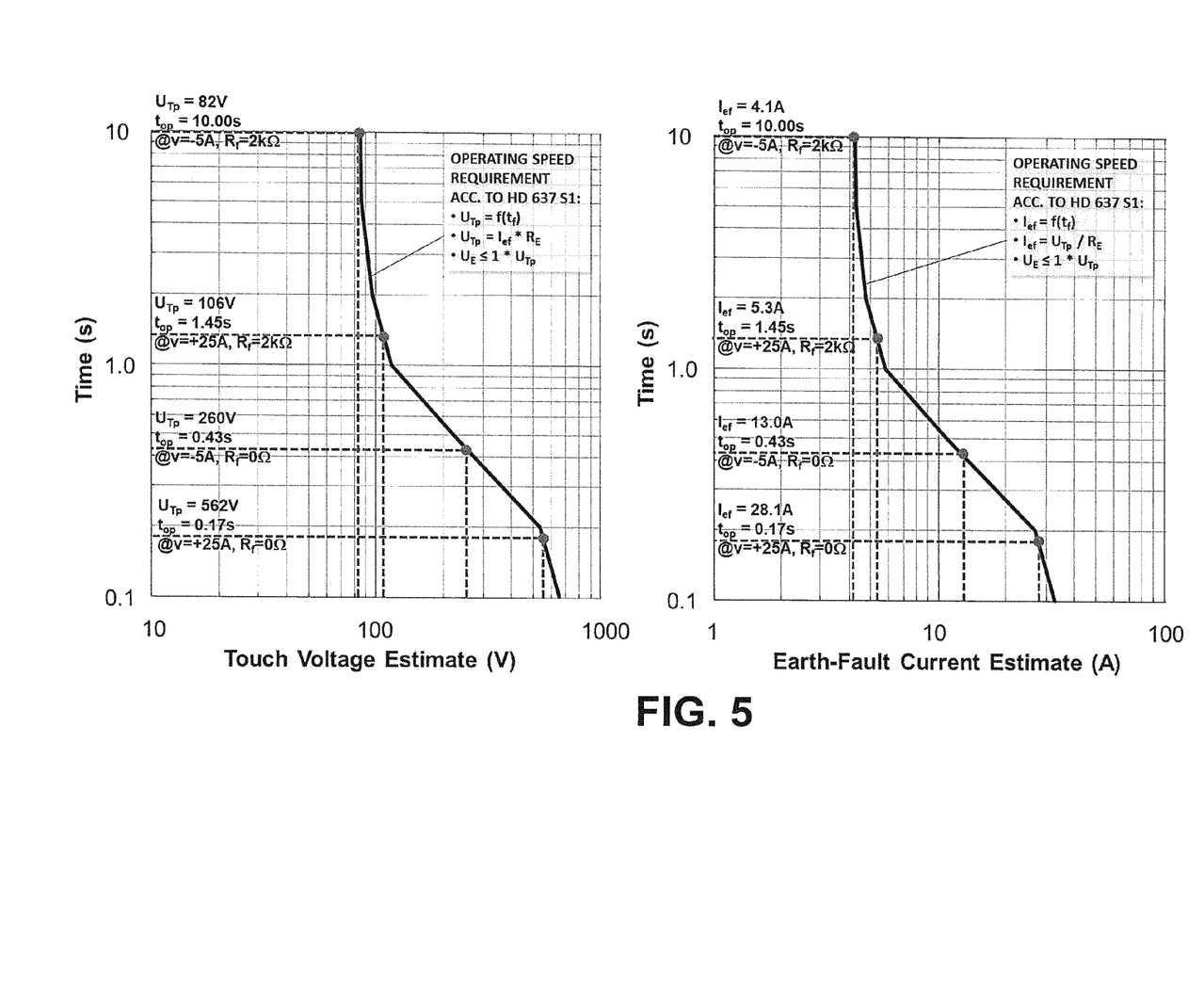
FIG. 5 shows an example of applying a valid earth-fault current estimate into an adaptation of an earth-fault protection operation time.

An example of an adaptation of the protection operate speed according to the valid earth-fault current estimate is illustrated in FIG. 5. A corresponding touch voltage estimate is also shown in FIG. 5.

Network and feeder parameters:
$I_{efFd}$=37.2 A (the uncompensated capacitive earth-fault current produced by the protected feeder [A])
$I_{efNet}$=121 A (the uncompensated capacitive earth-fault current produced by the network [A])
Id=12.1 A (total damping in amperes, applies to coil and network including the parallel resistor)
Iv=−5 A or +25 A (normally undercompensated or temporary overcompensated network)
$R_E$=200 hms
r=1, k=1
Estimate 1: $I_{ef}$=13.0 A@Iv=−5 A during a solid single-phase earth fault results in $U_{Tp}$ of 260 V and 0.43 s of operate time $t_{op}$ correspondingly
Estimate 2: $I_{ef}$=4.1 A@Iv=−5 A during a resistive single-phase earth fault ($R_f$=2000 Ohms) results in $U_{Tp}$ of 82 V and of 10.0 s operate time $t_{op}$
Estimate 3: $I_{ef}$=28.1 A@Iv=+25 A during a solid single-phase earth fault results in $U_{Tp}$ of 562 V and 0.17 s of operate time $t_{op}$ correspondingly
Estimate 4: $I_{ef}$=5.3 A@Iv=+25 A during a resistive single-phase earth fault ($R_f$=2000 Ohms) results in $U_{Tp}$ of 106 V and of 1.45 s operate time $t_{op}$ According to an embodiment, an estimate of a fault resistance at the point of the detected earth fault can be derived from estimated valid earth-fault current together with the information of the faulted phase-to-earth voltage according to Equation 16a or without the information of the faulted phase-to-earth voltage according to Equation 16b or 16c:

$$R_f = \text{real}\left(\frac{U^1_{ph\_faulty}}{I^1_{ef}}\right) \quad \text{Eq. 16a}$$

$$R_f = U_{PE} \cdot \left(\frac{1 - \frac{U^1_0}{U_{PE}}}{\frac{U^1_0}{U_{PE}} \cdot I^1_{ef}}\right) \quad \text{Eq. 16b}$$

$$R_f = U_{PE} \cdot \left(\frac{1 - \frac{\Delta U^1_0}{U_{PE}}}{\frac{\Delta U^1_0}{U_{PE}} \cdot I^1_{ef}}\right) \quad \text{Eq. 16c}$$

where
$U^1_{ph\_faulty}$ is the fundamental frequency component of the phase-to-earth voltage phasor of the faulted phase (phase A, phase B or phase C) during the fault.
$I^1_{ef}$ is the fundamental frequency component of the valid earth-fault current estimate.
$U^1_0$ is the magnitude of the fundamental frequency component of the zero-sequence voltage during the fault.
$\Delta U^1_0 = \text{abs}(\overline{U}^1_{0\_tF} - \overline{U}^1_{0\_tP})$ is the change in phasor magnitude of the fundamental frequency component of the zero-sequence voltage due to the fault.
$I^1_{ef}$ is the magnitude of the fundamental frequency component of the valid earth-fault current estimate.

Figure 6:
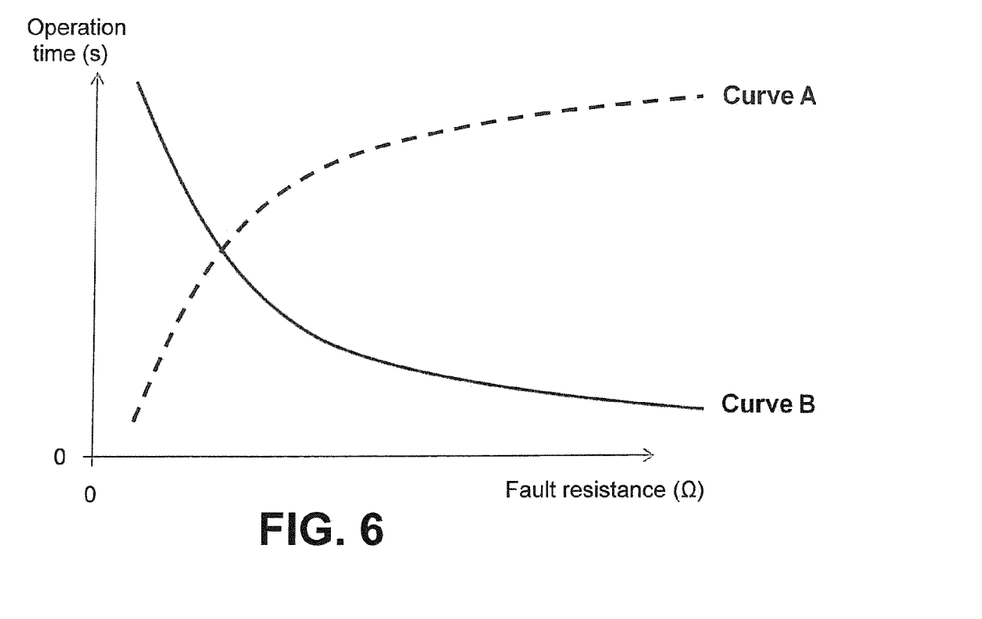
FIG. 6 shows an example of a fault resistance vs operation speed relationship according to embodiments.

The operation time for the earth-fault protection can be based on the magnitude of the estimated fault resistance according to a pre-defined fault resistance magnitude vs. protection operation time characteristics, for instance. Examples of such characteristics are shown in FIG. 6.

The different ways of determining the operation time for the earth-fault protection, including directly on the basis of the determined estimate of the earth-fault current, and indirectly on the basis of the determined estimate of the earth-fault current by first determining a fault resistance estimate or a touch voltage estimate, can also be utilized to complement each other. For example, the operation time for the earth-fault protection could be determined by two or three different ways and the shortest determined operation time could be selected as the operation time for the earth-fault protection to be used.

The estimate of the fault resistance obtained from Equation 16a or Equation 16b, 16c above may be utilized in various ways. According to an embodiment, it is possible to classify faults to low(er) and high(er) ohmic faults based on the fault resistance value. This information could also be used e.g. to determine the faulted line section: in case the electric line has cable and overhead line sections, it may be more probable that a high(er) ohmic fault occurs at an overhead line section, for example. The resistance value could also be utilized as an additional criterion to adapt protection operation time. An independent operation time vs. fault resistance function can be applied utilizing the fault resistance estimate from Equations 16a or 16b, 16c. Such a function could e.g. increase protection operation speed in case a low ohmic fault (curve A in FIG. 6). Alternatively, such a function could e.g. increase protection operation speed in case a high(er) ohmic fault is detected (curve B in FIG. 6). In such a case, the earth-fault current magnitude based adaptation of the protection speed would probably result in a slow operation speed. Adding a condition, which would accelerate the operation speed during a high(er) ohmic fault, could increase personnel safety in case a live phase conductor falls to ground and creates a high ohmic fault, for instance.

According to an embodiment, the valid earth-fault current estimate could be used, additionally or alternatively, for determining 230 a time instance, when a possible fault arc extinguishes at the fault location 60. At this time instance, the network 50 starts a recovery process to a healthy state. This may occur through oscillations with frequency and time constant defined by network parameters. Post-fault oscillations can be seen in the measured zero-sequence voltage and residual currents of all feeders in the substation, and they may lead to a maloperation of existing earth-fault protection, especially in healthy feeders. A feature of the proposed earth-fault current estimate as described above is that it is not affected by this phenomenon; post-fault oscillations are not seen in the (valid) earth-fault current estimate. As a result, an essentially real-time detection of a fault arc-extinguishment can be done as follows, either individually or together:

After the phase-to-earth fault is detected, the magnitude of the valid earth-fault estimate $I^n_{ef}$ is monitored (essentially in real-time). When the magnitude of estimate $I^n_{ef}$ is decreasing and it drops below a predetermined value defining an arc-extinguishment, then arc-extinguishment may be declared.

According to an embodiment, to secure the previous decisions, a negative derivative of $\overline{U}_o^1$ magnitude could be added for the criterion of arc-extinguishment.

The determined fault arc extinguishment time can be utilized in various ways, e.g. to prevent sympathetic tripping of healthy feeders during post-fault oscillation. By sending a block signal at time when fault arc extinguishment is detected, mal-operations of healthy feeders during the post-fault oscillation can be prevented, for instance.

The various embodiments described herein may be used in order to enhance the performance of existing earth-fault protection functions as follows:

Improvement in dependability and safety: a trip decision (or generally operation time) may be based on the true earth-fault current magnitude possibly including the harmonic components. Monitoring the magnitude of the earth-fault current provides new information, which can be used to improve the dependability of a trip decision or identification of a faulted feeder/line segment.

Safety of operation in all operating conditions of a practical network becomes ensured as a tripping could be made more accurately and strictly according to limits dictated by applicable electrical safety codes, for example. This may be especially valid and important in unplanned operating conditions, where the magnitude of the earth-fault current may be unexpectedly high.

Improvement in security: a protection trip decision may be blocked, when an earth-fault current magnitude estimate does not exceed a predetermined threshold. This prevents protection maloperations, e.g. sympathetic trippings, or unwanted tripping during the post-fault oscillations after earth-fault arc extinguishment. Monitoring the magnitude of the earth-fault current can provide new information, which can be used for improving the security of a trip decision or identification of a healthy feeder/line segment.

New fault information: fault type, fault resistance value, faulted phase identification, magnitude of earth-fault current can be used to enhance fault classification. This new information may enable a further optimization of tripping times and autoreclosing sequences depending on the fault type, and provide additional information of a possible cause and location of the fault.

Additionally the quality of power supply may be improved especially in compensated networks as the operate time of earth-fault protection can be adapted in real time according to the valid earth-fault current estimate so that a direct compliance of protection operation speed to applicable electrical safety codes can be achieved and maintained. This may enable that operate times of earth-fault protection can even be prolonged in a controlled manner without endangering the safety of operation. Thus, more time can be allowed for temporary earth faults and/or earth-fault arcs to be self-extinguished without causing immediate disconnection or tripping of the faulty feeder or part of the network. This way the number of supply interruptions due to earth faults could be reduced.

An apparatus according to any one of the above embodiments, or a combination thereof, may be implemented as a single unit or as two or more units that are configured to implement the functionality of the various embodiments. Here the term 'unit' refers generally to a physical or logical entity, such as a physical device or a part thereof or a software routine. One or more of these units may reside in the protective relay unit 41, for example.

An apparatus for implementing the functionality according to any of the embodiments may be implemented at least partly by means of one or more computers or corresponding digital signal processing (DSP) equipment provided with suitable software, for example. Such a computer or digital signal processing equipment preferably comprises at least a working memory (RAM) providing storage area for arithmetical operations, and a central processing unit (CPU), such as a general-purpose digital signal processor. The CPU may comprise a set of registers, an arithmetic logic unit, and a control unit. The CPU control unit is controlled by a sequence of program instructions transferred to the CPU from the RAM. The CPU control unit may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The computer may also have an operating system which may provide system services to a computer program written with the program instructions. The computer or other apparatus implementing the invention, or a part thereof, may further comprise suitable input means for receiving e.g. measurement and/or control data, and output means for outputting e.g. control or other data. It is also possible to use a specific integrated circuit or circuits, or discrete electric components and devices for implementing the functionality according to any one of the embodiments.

The invention can be implemented in existing system elements, such as various protective relays or similar devices, or by using separate dedicated elements or devices in a centralized or distributed manner. Present protective devices for electric systems, such as protective relays, may comprise processors and memory that may be utilized in the functions according to the various embodiments described herein. Thus, all modifications and configurations required for implementing an embodiment in existing electric system components, may be performed as software routines, which may be implemented as added or updated software routines. If at least part of the functionality of the invention is implemented by software, such software may be provided as a computer program product comprising computer program code which, when run on a computer, causes the computer or corresponding arrangement to perform the functionality according to the embodiments as described herein. Such a computer program code may be stored or generally embodied on a computer readable medium, such as suitable memory, e.g. a flash memory or an optical memory, from which it is loadable to the unit or units executing the program code. In addition, such a computer program code implementing the invention may be loaded to the unit or units executing the computer program code via a suitable data network, for example, and it may replace or update a possibly existing program code.

It will be obvious to a person skilled in the art that, as the technology advances, the inventive concept can be implemented in various ways. The invention and its embodiments are not limited to the examples described above but may vary within the scope of the claims.

The invention claimed is:

1. A method for use in earth-fault protection in a three-phase electric network, comprising:
   detecting a phase-to-earth fault in the three-phase electric network;
   determining at a measuring point in the three-phase electric network, for each of the three phases of the three-phase electric network, a change in a phase current due to the detected phase-to-earth fault, the determining comprising determining, for each of the three phases of the three-phase electric network, a difference between a fundamental frequency component of the phase current during the phase-to-earth fault and the fundamental frequency component of the phase current before the phase-to-earth fault, and/or determining, for each of the three phases of the three-phase electric network, and for at least one harmonic frequency, which is an integer multiple of the fundamental frequency of the phase current, a difference between a harmonic frequency component of the phase current during the phase-to-earth fault and the harmonic frequency component of the phase current before the phase-to-earth fault;

determining an estimate of an earth-fault current in a point of the detected phase-to-earth fault passing through the measuring point on the basis of the determined changes in the phase currents of the three phases of the three-phase electric network by using at least one of: an equation based on a change in a negative-sequence current component, an equation based on a change in a positive-sequence current component, an equation based on changes of the phase currents;

determining, if the estimate of the earth-fault current represents an actual earth-fault current or an apparent earth-fault current;

in response to determining that the estimate of the earth-fault current represents the actual earth-fault current, determining that the estimate of the earth-fault current is valid; and switching off or limiting the earth-fault current of the detected phase-to-earth fault in the three-phase electric network on the basis of the valid estimate of the earth-fault current.

2. The method of claim 1, comprising using the valid estimate of the earth-fault current in the earth-fault protection in the three-phase electric network.

3. The method of claim 1, wherein the determining, if the estimate of the earth-fault current represents an actual earth-fault current or an apparent earth-fault current, is based on one or more predetermined quantities comprising at least one current quantity at the measuring point.

4. The method of claim 3, wherein the determining, if the estimate of the earth-fault current represents an actual earth-fault current or an apparent earth-fault current, is based at least on a zero-sequence voltage of the three-phase electric network and a residual current at the measuring point, and/or on real and/or imaginary part of the estimate of the earth-fault current, and/or on real and/or imaginary part of the residual current at the measuring point and real and/or imaginary part of the estimate of the earth-fault current, and/or on a negative-sequence current component at the measuring point.

5. A computer program product comprising computer program code embodied on a non-transitory computer readable medium, wherein execution of the program code in a computer causes the computer to:

monitor phase currents of the three-phase electric network;

detect a phase-to-earth fault in the three-phase electric network;

determine at a measuring point in the three-phase electric network, for each of the three phases of the three-phase electric network, a change in a phase current of the phase currents due to the detected phase-to-earth fault by determining, for each of the three phases of the three-phase electric network, a difference between a fundamental frequency component of the phase current during the phase-to-earth fault and the fundamental frequency component of the phase current before the phase-to-earth fault, and/or by determining, for each of the three phases of the three-phase electric network, and for at least one harmonic frequency, which is an integer multiple of the fundamental frequency of the phase current, a difference between a harmonic frequency component of the phase current during the phase-to-earth fault and the harmonic frequency component of the phase current before the phase-to-earth fault;

determine an estimate of an earth-fault current in a point of the detected phase-to-earth fault passing through the measuring point on the basis of the determined changes in the phase currents of the three phases of the three-phase electric network by using at least one of: an equation based on a change in a negative-sequence current component, an equation based on a change in a positive-sequence current component, an equation based on changes of the phase currents;

determine, if the estimate of the earth-fault current represents an actual earth-fault current or an apparent earth-fault current, and to determine, in response to determining that the estimate of the earth-fault current represents the actual earth-fault current, that the estimate of the earth-fault current is valid; and switch off or limit the earth-fault current of the detected phase-to-earth fault in the three-phase electric network on the basis of the valid estimate of the earth-fault current.

6. An apparatus for use in earth-fault protection in a three-phase electric network, comprising:

means configured to monitor phase currents of the three-phase electric network;

means configured to detect a phase-to-earth fault in the three-phase electric network;

means configured to determine at a measuring point in the three-phase electric network, for each of the three phases of the three-phase electric network, a change in a phase current of the phase currents due to the detected phase-to-earth fault by determining, for each of the three phases of the three-phase electric network, a difference between a fundamental frequency component of the phase current during the phase-to-earth fault and the fundamental frequency component of the phase current before the phase-to-earth fault, and/or by determining, for each of the three phases of the three-phase electric network, and for at least one harmonic frequency, which is an integer multiple of the fundamental frequency of the phase current, a difference between a harmonic frequency component of the phase current during the phase-to-earth fault and the harmonic frequency component of the phase current before the phase-to-earth fault;

means configured to determine an estimate of an earth-fault current in a point of the detected phase-to-earth fault passing through the measuring point on the basis of the determined changes in the phase currents of the three phases of the three-phase electric network by using at least one of: an equation based on a change in a negative-sequence current component, an equation based on a change in a positive-sequence current component, an equation based on changes of the phase currents;

means configured to determine, if the estimate of the earth-fault current represents an actual earth-fault current or an apparent earth-fault current, and to determine, in response to determining that the estimate of the earth-fault current represents the actual earth-fault current, that the estimate of the earth-fault current is valid; and means configured to switch off or limit the earth-fault current of the detected phase-to-earth fault in the three-phase electric network on the basis of the valid estimate of the earth-fault current.

7. The apparatus of claim 6, comprising:

means configured to use the valid estimate of the earth-fault current in the earth-fault protection in the three-phase electric network.

8. An earth-fault protection device for a three-phase electric network, the device comprising a processor, and a memory storing instructions that, when executed by the processor, cause the device to:

monitor phase currents of the three-phase electric network;

detect a phase-to-earth fault in the three-phase electric network;

determine at a measuring point in the three-phase electric network, for each of the three phases of the three-phase electric network, a change in the phase current due to the detected phase-to-earth fault by determining, for each of the three phases of the three-phase electric network, a difference between a fundamental frequency component of the phase current during the phase-to-earth fault and the fundamental frequency component of the phase current before the phase-to-earth fault, and/or by determining, for each of the three phases of the three-phase electric network, and for at least one harmonic frequency, which is an integer multiple of the fundamental frequency of the phase current during the phase-to-earth fault and the harmonic frequency component of the phase current before the phase-to-earth fault;

determine an estimate of an earth-fault current in a point of the detected phase-to-earth fault passing through the measuring point on the basis of the determined changes in the phase currents of the three phases of the three-phase electric network by using at least one of: an equation based on a change in a negative-sequence current component, an equation based on a change in a positive-sequence current component, an equation based on changes of the phase currents;

determine, if the estimate of the earth-fault current represents an actual earth-fault current or an apparent earth-fault current, and to determine, in response to determining that the estimate of the earth-fault current represents the actual earth-fault current, that the estimate of the earth-fault current is valid; and trip one or more switching devices in the three-phase electric network and/or prevent a tripping of one or more switching devices in the three-phase electric network on the basis of the valid estimate of the earth-fault current.

9. The earth-fault protection device of claim 8, wherein the device is configured to use the valid estimate of the earth-fault current in the earth-fault protection in the three-phase electric network.

10. The earth-fault protection device of claim 8, wherein the device is configured to switch off or limit the earth-fault current of the detected phase-to-earth fault in the three-phase electric network on the basis of the valid estimate of the earth-fault current.

\* \* \* \* \*